United States Patent
Jung et al.

(10) Patent No.: US 10,431,275 B2
(45) Date of Patent: Oct. 1, 2019

(54) METHOD AND SYSTEM FOR PROVIDING MAGNETIC JUNCTIONS HAVING HYBRID OXIDE AND NOBLE METAL CAPPING LAYERS

(71) Applicant: Samsung Electronics Co., LTD., Gyeonggi-do (KR)

(72) Inventors: Hong-Sik Jung, Newark, CA (US); Xueti Tang, Fremont, CA (US)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 15/979,311

(22) Filed: May 14, 2018

(65) Prior Publication Data

US 2019/0272863 A1    Sep. 5, 2019

Related U.S. Application Data

(60) Provisional application No. 62/637,586, filed on Mar. 2, 2018.

(51) Int. Cl.

| G11C 11/00 | (2006.01) |
|---|---|
| G11C 11/16 | (2006.01) |
| H01L 43/12 | (2006.01) |
| H01L 27/22 | (2006.01) |
| H01L 43/10 | (2006.01) |
| H01L 43/02 | (2006.01) |

(52) U.S. Cl.
CPC ........ *G11C 11/161* (2013.01); *G11C 11/1659* (2013.01); *H01L 27/226* (2013.01); *H01L 43/02* (2013.01); *H01L 43/10* (2013.01); *H01L 43/12* (2013.01)

(58) Field of Classification Search
CPC ......... G11C 11/16; G11C 11/15; H01L 43/08; H01L 27/228
USPC ................................ 365/158, 171, 173, 174
See application file for complete search history.

(56) References Cited

U.S. PATENT DOCUMENTS

| 6,985,385 | B2 | 1/2006 | Nguyen |
| 7,067,331 | B2 | 6/2006 | Slaughter |
| 7,105,372 | B2 | 9/2006 | Min |
| 7,576,956 | B2 | 8/2009 | Huai |
| 7,602,033 | B2 | 10/2009 | Zhao |
| 7,973,349 | B2 | 7/2011 | Huai |
| 8,058,697 | B2 | 11/2011 | Guo |
| 8,854,876 | B2 | 10/2014 | Uchida |
| 8,878,318 | B2 | 11/2014 | Chen |
| 9,172,032 | B2 | 10/2015 | Shen |
| 9,537,090 | B1 | 1/2017 | Hu |
| 2004/0136121 | A1* | 7/2004 | Mao ............ B82Y 10/00 360/324.11 |

(Continued)

*Primary Examiner* — Son T Dinh
(74) *Attorney, Agent, or Firm* — Van Pelt, Yi & James LLP

(57) ABSTRACT

A magnetic apparatus, a memory using the magnetic apparatus and method for providing the magnetic apparatus are described. The magnetic apparatus includes a magnetic junction and a hybrid capping layer adjacent to the magnetic junction. The hybrid capping layer includes an insulating layer, a discontinuous oxide layer, and a noble metal layer. The discontinuous oxide layer is between the insulating layer and the noble metal layer. The insulating layer is between the magnetic junction and the noble metal layer. In one aspect, the magnetic junction includes a reference layer, a nonmagnetic spacer layer that may be a tunneling barrier layer and a free layer.

20 Claims, 6 Drawing Sheets

(56) References Cited

U.S. PATENT DOCUMENTS

| | | | |
|---|---|---|---|
| 2009/0039879 A1* | 2/2009 | Dieny | B82Y 25/00 324/252 |
| 2012/0002463 A1 | 1/2012 | Ranjan | |
| 2016/0351799 A1 | 12/2016 | Xue | |
| 2017/0294482 A1 | 10/2017 | Hu | |

* cited by examiner

METHOD AND SYSTEM FOR PROVIDING MAGNETIC JUNCTIONS HAVING HYBRID OXIDE AND NOBLE METAL CAPPING LAYERS

CROSS-REFERENCE TO RELATED APPLICATIONS

This application claims the benefit of provisional Patent Application Ser. No. 62/637,586, filed Mar. 2, 2018, entitled PERPENDICULAR MAGNETIC JUNCTION/MAGNETIC CELL HAVING HYBRID OXIDE AND NOBLE METAL LAYERS, assigned to the assignee of the present application, and incorporated herein by reference.

BACKGROUND OF THE INVENTION

Magnetic memories, particularly magnetic random access memories (MRAMs), have drawn increasing interest due to their potential for high read/write speed, excellent endurance, non-volatility and low power consumption during operation. An MRAM can store information utilizing magnetic materials as an information recording medium. One type of MRAM is a spin transfer torque magnetic random access memory (STT-MRAM). STT-MRAM utilizes magnetic junctions written at least in part by a current driven through the magnetic junction. A spin polarized current driven through the magnetic junction exerts a spin torque on the magnetic moments in the magnetic junction. As a result, layer(s) having magnetic moments that are responsive to the spin torque may be switched to a desired state.

For example, a conventional magnetic tunneling junction (MTJ) may be used in a conventional STT-MRAM. The conventional MTJ uses seed layer(s), may include capping layers and may include an antiferromagnetic (AFM) layer to fix the magnetization of the reference layer. The conventional MTJ includes seed layer(s), a reference layer, a tunneling barrier layer, a free layer and a capping layer. A bottom contact below the MTJ and a top contact on the MTJ may be used to drive current through the MTJ in a current-perpendicular-to-plane (CPP) direction. The reference layer and the free layer are magnetic. The magnetization of the reference layer is fixed, or pinned, in a particular direction. The free layer has a changeable magnetization. The free layer and reference layer may be a single layer or include multiple layers.

To switch the magnetization of the free layer, a current is driven in the CPP direction. When a sufficient current is driven from the top contact to the bottom contact, the magnetization of the free layer may switch to be parallel to the magnetization of a bottom reference layer. When a sufficient current is driven from the bottom contact to the top contact, the magnetization of the free layer may switch to be antiparallel to that of the bottom reference layer. The differences in magnetic configurations correspond to different magnetoresistances and thus different logical states (e.g. a logical "0" and a logical "1") of the conventional MTJ.

Because of their potential for use in a variety of applications, research in magnetic memories is ongoing. It is desirable to scale the magnetic junction to smaller areal dimensions (e.g. for increased memory density) without significantly degrading magnetic and electrical properties. For example, nonvolatile magnetic memories are desired to be scaled below forty nanometers. The operating temperatures for high operating temperature magnetic memory applications of magnetic memories are typically relatively high, for example, above one hundred degrees Celsius. The magnetic thermal stability factor, $\Delta$, and thus the effective magnetic anisotropy constant, $K_{Ueff}$, are desired to remain high. Current magnetic junctions are unable to be scaled to such dimensions without adversely affecting one or more of the saturation magnetization, exchange stiffness, damping and/or effective magnetic anisotropy constant. Further, even at current dimensions, performance is desired to be improved.

Accordingly, what is needed is a method and system that may improve the performance and scalability of magnetic devices and the electronic devices in which such magnetic devices are used. The method and system described herein address such a need.

BRIEF SUMMARY OF THE INVENTION

A magnetic apparatus, a memory using the magnetic apparatus and method for providing the magnetic apparatus are described. The magnetic apparatus includes a magnetic junction and a hybrid capping layer adjacent to the magnetic junction. The hybrid capping layer includes an insulating layer, a discontinuous oxide layer, and a noble metal layer. The discontinuous oxide layer is between the insulating layer and the noble metal layer. The insulating layer is between the magnetic junction and the noble metal layer. In one aspect, the magnetic junction includes a reference layer, a nonmagnetic spacer layer that may be a tunneling barrier layer and a free layer. In such an aspect, the hybrid capping layer may be adjacent to the free layer.

The magnetic junction may have improved performance when used with the hybrid capping layer. More specifically, the magnetic junction may enjoy an enhanced effective magnetic anisotropy constant without a significant degradation in saturation magnetization, resistance area product, TMR and/or damping constant. As a result, performance may be improved.

DETAILED DESCRIPTION OF THE INVENTION

Figure 1:
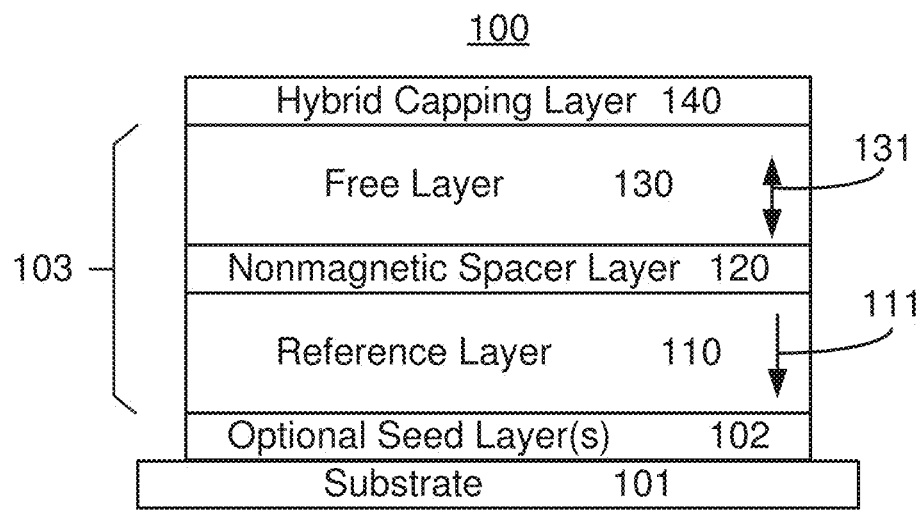
FIG. 1 depicts an exemplary embodiment of a magnetic apparatus usable and including a hybrid capping layer.

The exemplary embodiments relate to magnetic junctions usable in magnetic devices, such as magnetic memories, and the devices using such magnetic junctions. The magnetic memories may include spin transfer torque magnetic random access memories (STT-MRAMs) spin-orbit torque (SOT) devices, logic or other devices employing STT or SOT magnetic junctions and/or other electronic devices. Such electronic devices include but are not limited to cellular phones, smart phones, tables, laptops and other portable and non-portable computing devices. The following description is presented to enable one of ordinary skill in the art to make and use the invention and is provided in the context of a patent application and its requirements. Various modifications to the exemplary embodiments and the generic principles and features described herein will be readily apparent. The exemplary embodiments are mainly described in terms of particular methods and systems provided in particular implementations. However, the methods and systems will operate effectively in other implementations. Phrases such as "exemplary embodiment", "one embodiment" and "another embodiment" may refer to the same or different embodiments as well as to multiple embodiments. The embodiments will be described with respect to systems and/or devices having certain components. However, the systems and/or devices may include more or fewer components than those shown, and variations in the arrangement and type of the components may be made without departing from the scope of the invention. The exemplary embodiments will also be described in the context of particular methods having certain steps. However, the method and system operate effectively for other methods having different and/or additional steps and steps in different orders that are not inconsistent with the exemplary embodiments. Thus, the present invention is not intended to be limited to the embodiments shown, but is to be accorded the widest scope consistent with the principles and features described herein.

A magnetic apparatus, a memory using the magnetic apparatus and method for providing the magnetic apparatus are described. The magnetic apparatus includes a magnetic junction and a hybrid capping layer adjacent to the magnetic junction. The hybrid capping layer includes an insulating layer, a discontinuous oxide layer, and a noble metal layer. The discontinuous oxide layer is between the insulating layer and the noble metal layer. The insulating layer is between the magnetic junction and the noble metal layer. In one aspect, the magnetic junction includes a reference layer, a nonmagnetic spacer layer that may be a tunneling barrier layer and a free layer.

The exemplary embodiments are described in the context of particular methods, magnetic junctions and magnetic memories having certain components. One of ordinary skill in the art will readily recognize that the present invention is consistent with the use of magnetic junctions and magnetic memories having other and/or additional components and/or other features not inconsistent with the present invention. The method and system are also described in the context of current understanding of the spin transfer phenomenon, of magnetic anisotropy, and other physical phenomenon. Consequently, one of ordinary skill in the art will readily recognize that theoretical explanations of the behavior of the method and system are made based upon this current understanding of spin transfer, magnetic anisotropy and other physical phenomena. However, the method and system described herein are not dependent upon a particular physical explanation. One of ordinary skill in the art will also readily recognize that the method and system are described in the context of a structure having a particular relationship to the substrate. One of ordinary skill in the art will readily recognize that the method and system are consistent with other structures. In addition, the method and system are described in the context of certain layers being synthetic and/or simple. However, one of ordinary skill in the art will readily recognize that the layers could have another structure. Furthermore, the method and system are described in the context of magnetic junctions and/or substructures having particular layers. One of ordinary skill in the art will readily recognize that magnetic junctions and/or substructures having additional and/or different layers not inconsistent with the method and system could also be used. Moreover, certain components are described as being magnetic, ferromagnetic, and ferrimagnetic. As used herein, the term magnetic could include ferromagnetic, ferrimagnetic or like structures. Thus, as used herein, the term "magnetic" or "ferromagnetic" includes, but is not limited to ferromagnets and ferrimagnets. As used herein, "in-plane" is substantially within or parallel to the plane of one or more of the layers of a magnetic junction. Conversely, "perpendicular" and "perpendicular-to-plane" corresponds to a direction that is substantially perpendicular to one or more of the layers of the magnetic junction. The method and system are also described in the context of certain alloys. Unless otherwise specified, if specific concentrations of the alloy are not mentioned, any stoichiometry not inconsistent with the method and system may be used.

FIG. 1 depicts an exemplary embodiment of a magnetic apparatus 100 including a magnetic junction 103 and a hybrid capping layer 140. The magnetic apparatus 100 may be usable in a magnetic memory or other device, programmable using spin transfer torque and/or spin-orbit torque. For clarity, FIG. 1 is not to scale and not all components may be shown. The magnetic apparatus 100 may, therefore, be used in a variety of electronic devices.

The magnetic junction 103 may be programmable using spin orbit torque (SOT) and/or spin transfer torque (STT). In the embodiment shown, the magnetic junction 103 includes a reference layer 110 having a magnetic moment 111, a nonmagnetic spacer layer 120 and a free layer 130 having magnetic moment 131. The substrate 101 on which the magnetic junction 103 is formed resides below the seed layers and is shown for clarity. Also shown are optional seed layer(s) 102. A bottom contact and a top contact are not shown but may be formed. Other layers such as coupling layers, polarization enhancement layer(s) (PEL(s)) and anti-ferromagnetic (AFM) and/or other layers may be present. However, such layers are not shown for simplicity. As can be seen in FIG. 1, the magnetic junction 103 has its reference layer 110 closest to the substrate 101. The magnetic junction 103 is a bottom pinned magnetic junction. In other embodiments, other configurations might be possible.

The free layer 130 may have a high perpendicular magnetic anisotropy (PMA). In such an embodiment, the free layer 130 has a PMA energy greater than a free layer out-of-plane demagnetization energy. Thus, the moment 131 is stable perpendicular-to-plane. As can be inferred from the double-headed arrow, the free layer magnetic moment 131 may be stable when pointed toward the top of the page and when pointed toward the bottom of the page in FIG. 1. In alternate embodiments, the magnetic moment 131 may be stable in-plane. The free layer 130 is depicted as a single layer. However, in other embodiments, the free layer 130 may be a multilayer with a different saturation magnetization and crystallization temperature(s). The free layer 130 might be a synthetic antiferromagnet (SAF) including multiple ferromagnetic layers interleaved with and sandwiching one or more nonmagnetic layers. For example, the free layer 130 might include two ferromagnetic layers separated by a nonmagnetic layer, such as a Ru, Ir, Mo or W layer. The thickness of the nonmagnetic layer may be selected so that the ferromagnetic layers are antiferromagnetically coupled via a Ruderman-Kittel-Kasuya-Yosida (RKKY) coupling or magnetostatic interactions. Alternatively, the nonmagnetic layer thickness may be selected for ferromagnetic coupling. In other embodiments, the free layer 130 might be some other multilayer and/or may have layer(s) coupled in another manner. In some embodiments, the free layer may include or consist of FeB, FeB—X, FeCoB, FeCoB—X, B free Fe, Fe—X, FeCo and FeCo—X, where X is selected from Be, Ni, Mo, Mg, Zr, Ta, V, Cr, W, Hf, Nb and Tb. As used herein, an alloy such as FeB indicates an alloy of $Fe_{1-y}B_y$, where $0 \leq y < 0.5$. For simplicity, the exact stoichiometry is not indicated. Other or additional alloys and/or multilayers may be used in other embodiments.

The free layer 130 has a changeable magnetic moment 131 and, therefore, may be used to store data. The magnetic junction 103 is also configured to allow the free layer magnetic moment 131 to be switched between stable magnetic states using a write current is passed through the magnetic junction 103 and/or using a current passed through an adjacent line (not shown) having a high spin orbit coupling. Thus, the free layer 130 is switchable utilizing spin transfer torque when a write current is driven through the magnetic junction 103 in a current perpendicular-to-plane (CPP) direction and/or via spin orbit torque. Depending upon the direction of the write current, the free layer 130 may be programmed to different states. The direction of the magnetic moment 131 of the free layer 130 may be read by driving a read current through the magnetic junction 103. Such a read current is less than the spin transfer write current and insufficient to switch the direction of the magnetic moment.

The nonmagnetic spacer layer 120 may be a tunneling barrier layer. For example, the nonmagnetic spacer 120 may be a crystalline MgO tunneling barrier with a (100) orientation. Such a nonmagnetic spacer layer 120 may not only enhance the tunneling magnetoresistance (TMR) of the magnetic junction 103, but also increase the PMA of the free layer 130. A crystalline MgO tunneling barrier layer 120 may have a thickness of at least eight Angstroms and not more than fifteen Angstroms. For example, a crystalline MgO tunneling barrier layer 120 may be nominally at least ten and not more than twelve Angstroms thick. However, other thicknesses and/or other barrier layers may be possible. The nonmagnetic spacer layer 120 may also be considered to serve as a seed layer for the free layer 130. In an alternate embodiment, the nonmagnetic spacer layer 120 may have another structure including but not limited to being a conductive layer.

The reference layer 110, also known as a pinned layer, has a PMA energy greater than the out-of-plane demagnetization energy. Thus, the magnetic moment 111 is stable perpendicular-to-plane. The reference layer 110 is shown as being a single layer. However, in other embodiments, the pinned layer 110 may be a multilayer. For example, the pinned layer 110 might be a synthetic antiferromagnet (SAF) including multiple ferromagnetic layers interleaved with and sandwiching one or more nonmagnetic layers. For example, the reference layer 110 might include two ferromagnetic layers separated by a nonmagnetic layer, such as a Ru or Ir layer. The thickness of the Ru or Ir layer may be selected so that the ferromagnetic layers are antiferromagnetically coupled via a Ruderman-Kittel-Kasuya-Yosida (RKKY) coupling. In other embodiments, other multilayers may be used. For example, the pinned layer 110 may include a Co—Pt layer and/or a Co—Ir layer. For example, the pinned layer 110 may be or include a Co/Pt multilayer. In such a multilayer, one or more repeats of a Co/Pt bilayer ([Co/Pt]n, with n≥1) may be used. In some embodiments, the pinned layer 110 may be or include a Co/Ir multilayer. Such a multilayer has one or more repeats of a Co/Ir bilayer ([Co/Ir]n, with n≥1). In some embodiments, the optional pinning layer may be an AFM layer or multilayer that pins the magnetization(s) through an exchange-bias interaction. However, in other embodiments, the optional pinning layer may be omitted or another structure may be used. In the embodiment shown, the magnetic moment 111 of the pinned layer 110 is pinned by the magnetic anisotropy of the reference layer 110.

The hybrid capping layer 140 is adjacent to the magnetic junction 103 may be used to improve performance of the magnetic junction 103. In the embodiment shown, the hybrid capping layer 140 adjoins, or shares an interface with, the magnetic junction 103. Also in the embodiment shown, the hybrid capping layer 140 adjoins the free layer 130. The hybrid capping layer 140 includes an insulating layer, a discontinuous oxide layer, and a noble metal layer. The discontinuous oxide layer is between the insulting layer and the noble metal layer. The insulating layer is between the magnetic junction 103 and the noble metal layer. The insulating layer and the noble metal layer are oxygen blocking layers. The discontinuous oxide layer may be used to enhance migration of boron from the free layer 130 to toward the hybrid capping layer 140, which results in relatively less-boron containing tunneling interface between the free layer 130 and the nonmagnetic space layer 120.

Figure 2:
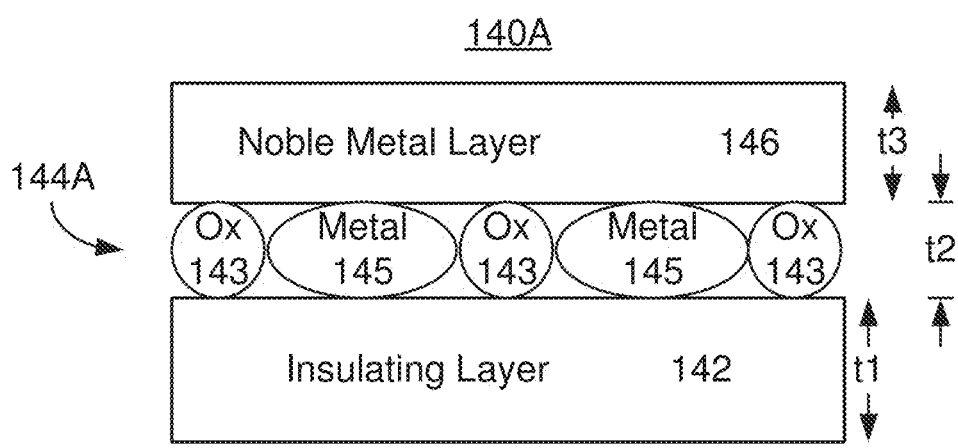
FIG. 2 depicts an exemplary embodiment of a hybrid capping layer usable in conjunction with a magnetic junction.

FIG. 2 depicts exemplary embodiments of hybrid capping layer 140A. FIG. 2 are not to scale. Referring to FIGS. 1-2, the hybrid capping layers 140 and 140A each include an insulating layer 142, a discontinuous oxide layer 144 and a noble metal layer 146. As discussed above, the noble metal layer 146 is an oxygen blocking layer. Thus, the material(s) for the noble metal layer are selected to be oxygen blockers. In some embodiments the noble metal layer 146 includes at least one of Ru, Pt, Ir, Rh, Pd and Os. In some embodiments, the noble metal layer 146 consists of Ru, Pt, Ir, Rh, Pd, Os, or an alloy including one or more of the above. The noble metal layer 146 also has a thickness of at least ten Angstroms and not more than one hundred Angstroms. In some embodiments, the noble metal layer 146 has a thickness is at least fifteen Angstroms and not more than eighty Angstroms. In some such embodiments, the thickness of the noble metal layer 146 is at least twenty Angstroms and not more than sixty Angstroms. In some cases, the improvements provided by the noble metal layer 146 saturate at a thickness of twenty Angstroms. However, other thicknesses may be possible in other embodiments.

The insulating layer 142 resides closest to the magnetic junction 103. The insulating layer 142 is amorphous as deposited. In some embodiments, the insulating layer 142 includes or consists of at least one of magnesium oxide-aluminum oxide ($MgO-Al_2O_3$), magnesium aluminum oxide ($MgAl_2O_4$), titanium oxide doped magnesium oxide ($TiO_2$-doped MgO) and zirconium oxide doped magnesium oxide ($ZrO_2$-doped MgO). In one embodiment, the insulating layer 142 consists of magnesium aluminum oxide. Use of materials such as $MgAl_2O_4$, which are more amorphous and denser than MgO, may protect free layer 130 from oxidation and diffusion.

Figure 3:
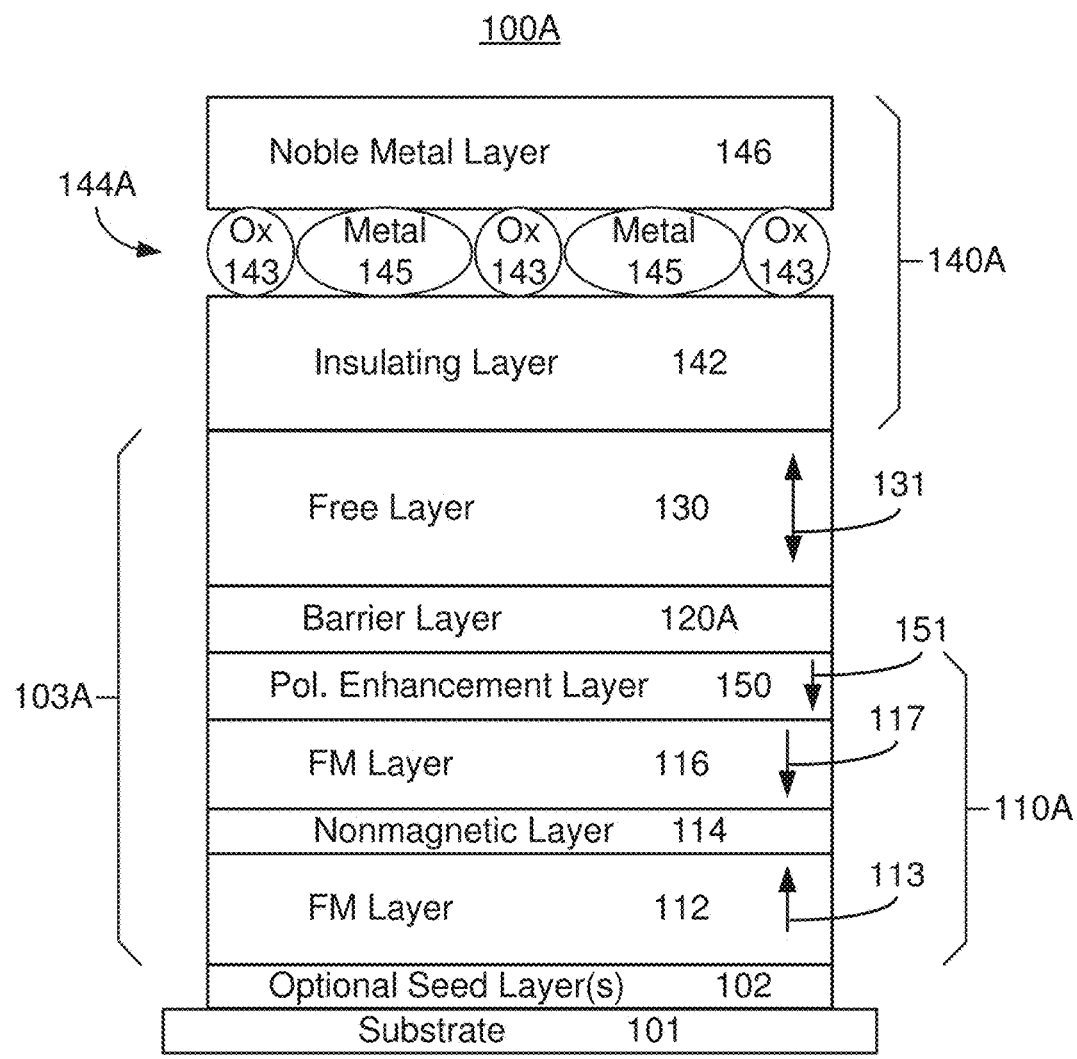
FIG. 3 depicts an exemplary embodiment of a magnetic apparatus usable and including a hybrid capping layer.
Figure 4A:
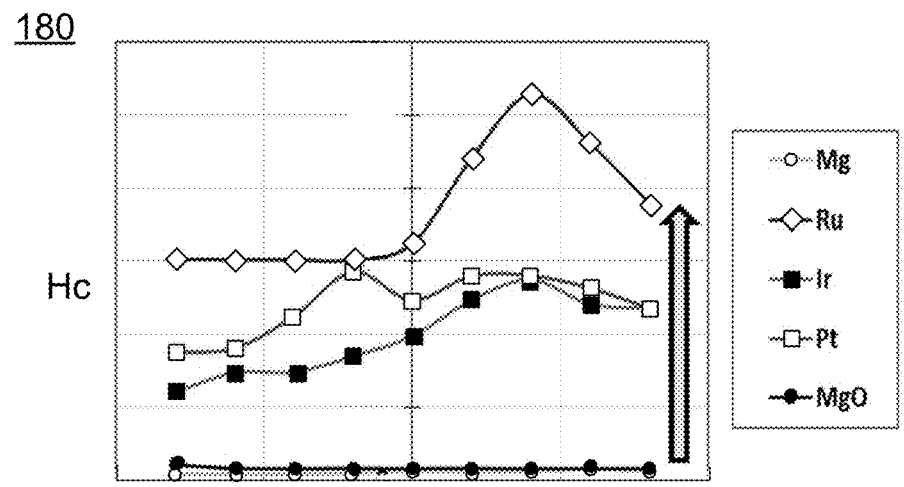
FIGS. 4A-4F depict the variation of properties of exemplary embodiments of the magnetic junction with thickness of the insulating layer.
Figure 4B:
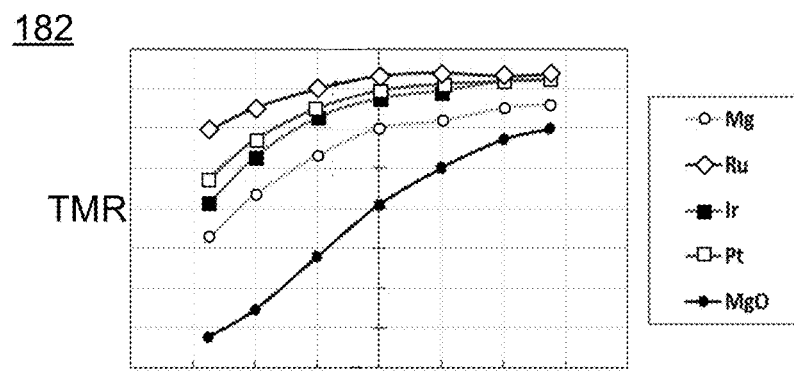
Figure 4C:
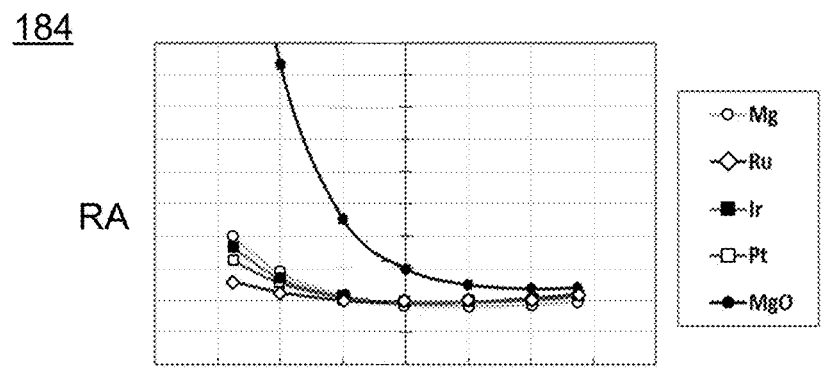
Figure 4D:
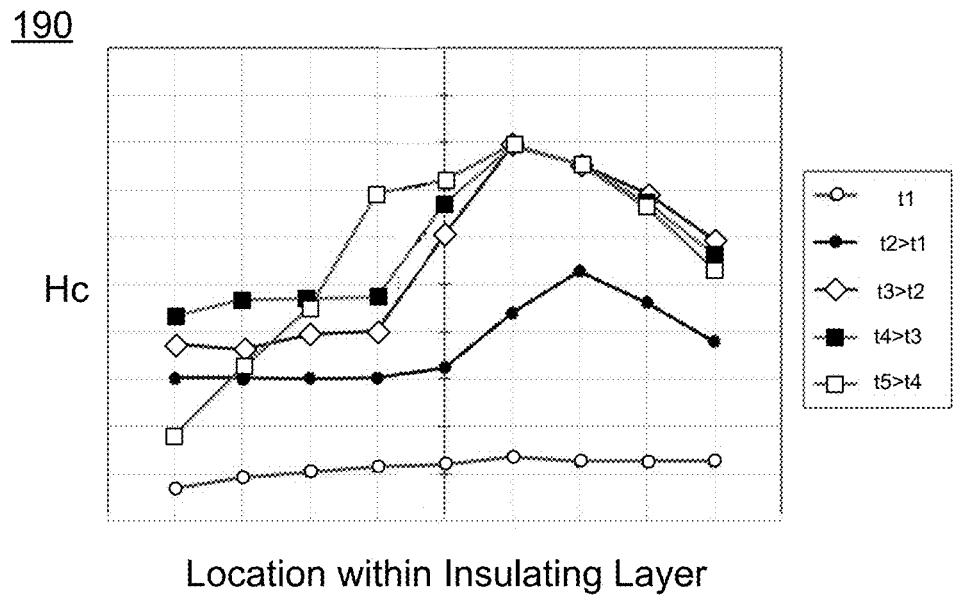
Figure 4E:
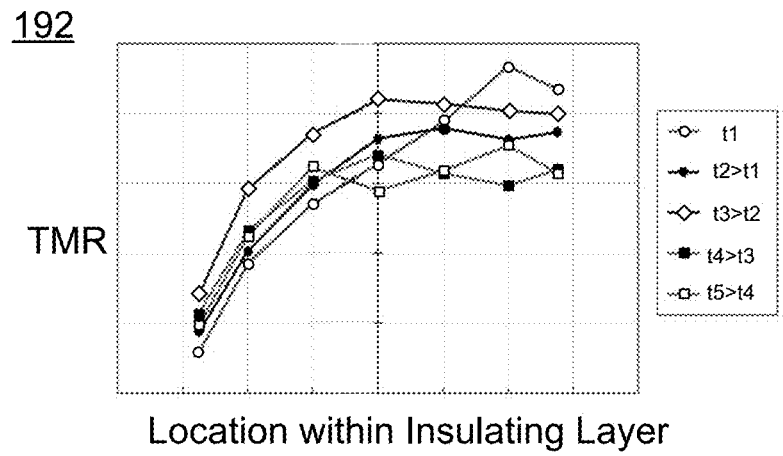
Figure 4F:
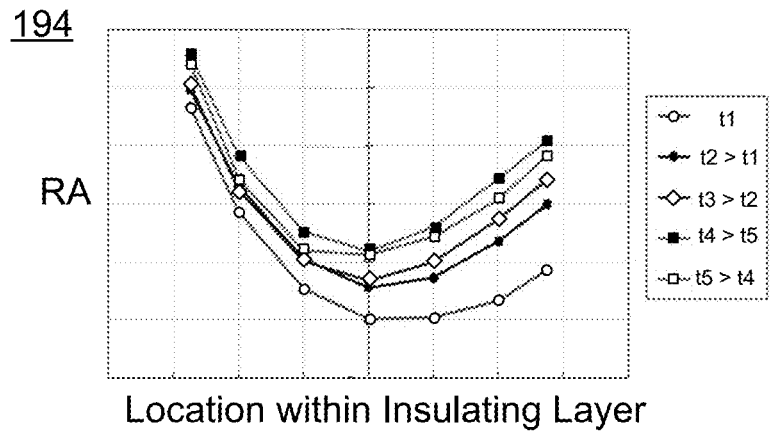

Discontinuous oxide layer 144A is also shown. Discontinuous oxide layer 144A may be formed by depositing a discontinuous metal layer and performing an oxidation step. Thus, metal islands may be formed and then oxidized. In the discontinuous oxide layer 144A, the area deposited with metal islands 145 remain, while other areas without metal islands have been oxidized to MgAl-oxide from the oxygen-deficient insulating layer 142. Both the thickness of a discontinuous metal layer and oxidation step may control the unique microstructure of a discontinuous oxide layer. However, these oxides formed by different oxygen affinity are not stable during the annealing process. When a Ta or Mg layer with high oxygen affinity is deposited on top of a discontinuous layer, these oxygen atoms are transferred into the Ta or Mg layer via a solid state oxidation process. A discontinuous oxide layer is not formed. However, when a noble metal layer with much less oxygen affinity is deposited on top of a discontinuous layer, the oxygen atoms trapped between the noble metal layer 146 and the insulating layer 142 remain. During the annealing process, the trapped oxygen atoms on the discontinuous oxide areas have strong boron affinity. This preferred extraction of boron from a free layer 130 to the hybrid capping layer 140 provides a gradient in boron concentration along the perpendicular direction; such that a higher boron content is close to the hybrid capping layer 140 and a much lower boron content is close to the nonmagnetic space layer 120. This unique process may enhance PMA and improve performance by providing better tunneling interface with less boron contamination. Although metal islands 145 are depicted as being larger than oxide islands 143, this is not necessarily the case. Further, the shapes and aspect ratios of the islands 143 and 145 are not intended to represent a particular implementation and are for explanatory purposes only. In addition, the sizes of the oxide islands 143 and metal islands may vary instead of being uniform as shown in FIGS. 2-3. In some embodiments, the metal used in the discontinuous oxide layer(s) 144A includes at least one of Mo, W, Nb and Zr. In some embodiments, only one of the metals Mo, W, Nb, and Zr is used. Thus, the oxide 143 may include one or more of molybdenum oxide, tungsten oxide, niobium oxide and zirconium oxide. In some embodiments, the oxide 143 might include Mg—Al-oxide, Mg—Ti-oxide and Mg—Zr-oxide from the oxygen deficient insulating layer 142. In some embodiments, the discontinuous oxide layer 143 has a thickness of at least 0.5 Angstroms and not more than three Angstroms.

FIG. 3 depicts an exemplary embodiment of a magnetic apparatus 100A that is usable in magnetic devices such as a magnetic memory programmable using spin transfer torque. For clarity, FIG. 3 is not to scale and not all components may be shown. The magnetic apparatus 100A is analogous to the magnetic apparatus 100. Consequently, similar components have analogous labels.

The magnetic apparatus 100A includes a magnetic junction 103A and a hybrid capping layer 140A. In an alternate embodiment, the hybrid capping layer 140B may be present instead. The magnetic junction 103A is a bottom pinned magnetic junction that includes reference layer 110A, polarization enhancement layer (PEL) 150 that is incorporated into the reference layer 110A, nonmagnetic spacer layer that is a tunneling barrier layer 120 and free layer 130 having magnetic moment 131. The reference layer 110A, tunneling barrier layer 120 and free layer 130 having magnetic moment 131 that are analogous to the reference layer 110, nonmagnetic spacer layer 120 and free layer 130 having magnetic moment 131 in FIG. 1. Optional seed layer 102 and substrate 101 are also shown.

The structure, function and material(s) used for the reference layer 110, barrier layer 120 and free layer 130 in the magnetic junction 100A are analogous to those used for the reference layer 110, nonmagnetic spacer layer 120 and free layer 130 in the magnetic junctions 103. For example, the barrier layer 120 may be a crystalline MgO barrier layer and the free layer 130 may include at least one of FeB, FeB—X, FeCoB, FeCoB—X, B free Fe, Fe—X, FeCo and FeCo—X, where X is selected from Be, Ni, Mo, Mg, Zr, Ta, V, Cr, W, Hf, Nb and Tb. However, in the embodiment shown, the reference layer 110A is a SAF. Thus, the reference layer 110A includes bottom ferromagnetic layers 112 and top ferromagnetic layers 116 and PEL 150 separated by a nonmagnetic layer 114, such as Ru or Ir. The ferromagnetic layers 112, 116 and 150 have magnetic moments 113, 117 and 151, respectively, that are antiferromagnetically coupled.

The reference layer 110 includes a PEL 150. A PEL 150 may include or consist of two parts: a polarization enhancement layer and a texture breaking layer. A texture breaking layer is amorphous in order to break a face centered cubic (FCC) texture (111) from crystalline ferromagnetic layers 112 and 116. It can be a single layer such as Ta, Mo, and W. It can be a dual or triple layer such as Ta/CoFeB and Ta/CoFeB/Ta. A polarization enhancement layer is ferromagnetic layer(s) with body centered cubic (BCC) structure for enhancing spin polarization before the barrier layer 120A. It can be either a single layer or multilayer. In some embodiments, a polarization enhancement layer includes B and at least one of Co and Fe. For example, the PEL may include a $(CoFe)_{(1-x)}B_x$ layer and/or a $Fe_{(1-x)}B_x$ layer. In such embodiments, where $0.2<x$. In some such embodiments, $x \leq 0.6$. However, in alternate embodiments, other stoichiometries and/or other materials may be used.

The hybrid capping layer 140A is also shown. The hybrid capping layer 140A is analogous to that shown in FIG. 2. Thus, the hybrid capping layer 140A includes an insulating layer 142 and a noble metal layer 146 that may function as oxygen blockers. In addition, the discontinuous oxide layer 144A having oxide islands 143 and metal islands 145 is also shown. The materials used in the layers 142, 144A and 146 may be analogous to those described above. In some embodiments, the insulating layer 142 is an $MgAl_2O_4$ layer, the discontinuous oxide layer includes Mo islands 145 and MgAl and partial Mo oxide islands 143 and the noble metal layer 146 is Ru. In other embodiments, the insulating layer 142 is an $MgAl_2O_4$ layer, the discontinuous oxide layer includes Nb islands 145 and MgAl and partial Nb oxide islands 143 and the noble metal layer 146 is Ru. In other embodiments, the insulating layer 142 is an $MgAl_2O_4$ layer, the discontinuous oxide layer includes Zr islands 145 and MgAl and partial Zr oxide islands 143 and the noble metal layer 146 is Ru. However, other materials such as those described above may be used.

The magnetic junction 103 may have improved performance. The hybrid capping layer 140/140A may increase the effective magnetic anisotropy constant, $K_{Ueff}$, substantially without degrading saturation magnetization, damping constant, resistance area product (RA) and TMR for the magnetic junction 103. This is particularly true for a magnetic junction 103 employing an MgO barrier layer as the nonmagnetic spacer layer 120. FIGS. 4A-4F depict the variation of properties of exemplary embodiments of the magnetic junction with thickness of the insulating layer. Graphs 180, 182 and 184 depict the variation of coercivity (Hc), TMR and RA with selected noble metals used for the layer 146. Graphs 190, 192 and 94 depict the variation of Hc, TMR and RA with different thicknesses from $t_1$ (5 Angstroms) to $t_5$ (60 Angstroms) of a Ru noble metal layer 146. However, in other embodiments, other thicknesses might be used. As can be seen in FIGS. 4A-4F, coercivity may be significantly improved while TMR and RA are maintained. Further, the noble metals Pt, Ir, and Ru exhibit improvements over Mg and MgO. In addition, the effect may saturate for thicknesses of the noble metal layer 146. For example, a magnetic junction having a conventional MgO or Ta-oxide capping layer may have a free layer $K_{Ueff}t$ of approximately 0.1-0.3 erg/cm$^2$. In contrast, in some embodiments, the $K_{Ueff}t$ for the free layer 130 in the magnetic apparatus 100 using the hybrid capping layer 140/140A may be on the order of 0.7 erg/cm$^2$. Thus, magnetic anisotropy is significantly enhanced. The RA, TMR and damping constant may be substantially maintained. For example, in some embodiments, the RA may be in the range of 10-11 $\Omega\mu m^2$ and the TMR in the range of 140-160%, which is higher or comparable TMR with conventional MgO or Ta-oxide capping layer. Similarly, the damping constant may remain in the range of damping constant of $\alpha=3-5\times10^{-3}$. Similarly, the saturation magnetization may be substantially maintained. However, other RAs, TMRs, damping constants, saturation magnetizations and $K_{Ueff}t$ are possible.

The magnetic apparatus 100A shares the benefits of the magnetic apparatus 100. The hybrid capping layer 140 may increase the effective magnetic anisotropy constant substantially without degrading saturation magnetization, damping constant, resistance area product (RA) and TMR for the magnetic junction 103A. Consequently, the magnetic apparatus 100A may have improved performance and increased scalability of bit size and high temperature operation applications.

Figure 5:
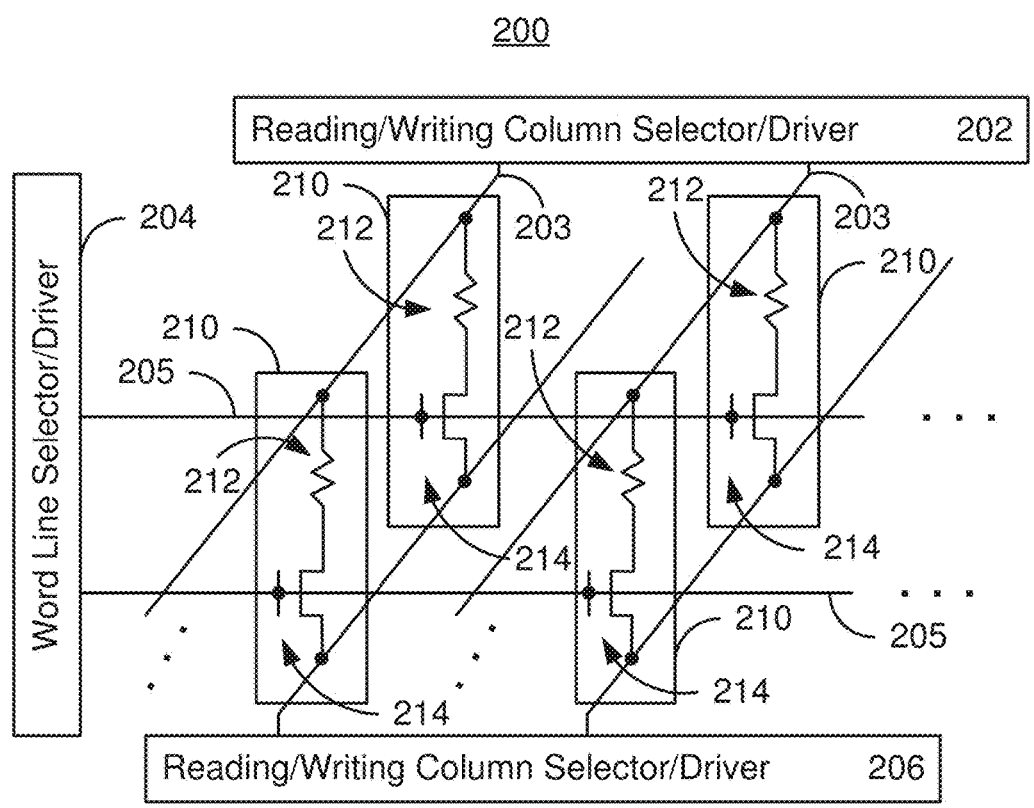
FIG. 5 depicts an exemplary embodiment of a memory utilizing magnetic junctions and hybrid capping layers in the memory element(s) of the storage cell(s).

FIG. 5 depicts an exemplary embodiment of a memory 200 that may use one or more of the magnetic apparatus 100 and 100A, the magnetic junctions 103/103A and hybrid capping layers 140/140A and/or other magnetic junctions. The magnetic memory 200 includes reading/writing column select drivers 202 and 206 as well as word line select driver 204. Note that other and/or different components may be provided. The storage region of the memory 200 includes magnetic storage cells 210. Each magnetic storage cell includes at least one magnetic apparatus 212 and at least one selection device 214. In some embodiments, the selection device 214 is a transistor. The magnetic apparatuses 212 may be one of the 100, 100A and/or other analogous magnetic apparatus(es). Although one magnetic apparatus junction 212 is shown per cell 210, in other embodiments, another number of magnetic apparatuses 212 may be provided per cell. Because the magnetic memory 200 includes one or more of the magnetic apparatuses 100, 100A and/or an analogous magnetic apparatus, the magnetic memory 200 may enjoy the benefits described above.

Various features have been described with respect to the magnetic apparatuses 100 and 100A and the magnetic memory 200. One of ordinary skill in the art will recognize that these features may be combined in manner(s) not shown and which are not inconsistent with the devices and methods described herein. Thus, the magnetic apparatus in accordance with the methods, systems and devices described herein need not be explicitly depicted.

Figure 6:
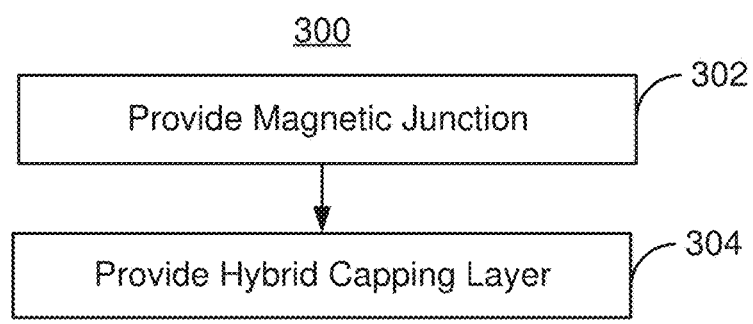
FIG. 6 is a flow chart depicting an exemplary embodiment of a method for providing a magnetic junction usable in a magnetic memory, programmable using spin transfer torque and including a hybrid capping layer.

FIG. 6 depicts an exemplary embodiment of a method 300 for fabricating a magnetic apparatus usable in a magnetic device such as an STT-MRAM, another STT device, SOT device and, therefore, in a variety of electronic devices. For simplicity, some steps may be omitted, performed in another order and/or combined. Further, the method 300 may start after other steps in forming a magnetic device have been performed. The method 300 is also described in the context of forming a single magnetic apparatus. However, multiple magnetic apparatuses may be formed substantially simultaneously. The method 300 is also described in the context of the magnetic apparatus 100. However, another magnetic junction such as the magnetic apparatus 100A might be formed.

The magnetic junction 103 is provided, via step 302. Step 302 includes depositing the materials for the layers 110, 120 and 130 and then defining the edges of the stack. For example, a mask may be provided on the layers that have been deposited and the exposed portions of the layers ion milled.

The hybrid capping layer 140/140A is also provided, via step 304. Step 304 includes providing layers 142, 144A and 146. In some embodiments, steps 302 includes providing the layers in a magnetic junction stack and the hybrid capping layer. The edges of the magnetic junction 103 and the hybrid capping layer 140 may be defined after all of these layers have been deposited. Additional structures, such as contacts and conductive lines may also be formed for the device in which the magnetic apparatus is used. Fabrication of the magnetic junction may then be completed.

Using the method 300, a magnetic apparatus having improved performance may be fabricated. The effective magnetic anisotropy constant of the free layer 130 may be improved substantially without sacrificing saturation magnetization, damping constant, RA and TMR for the magnetic junction 103/103A. Consequently, the magnetic apparatus 100/100A fabricated using the method 300 may have improved performance and increased scalability of bit size and high temperature operation applications.

Figure 7:
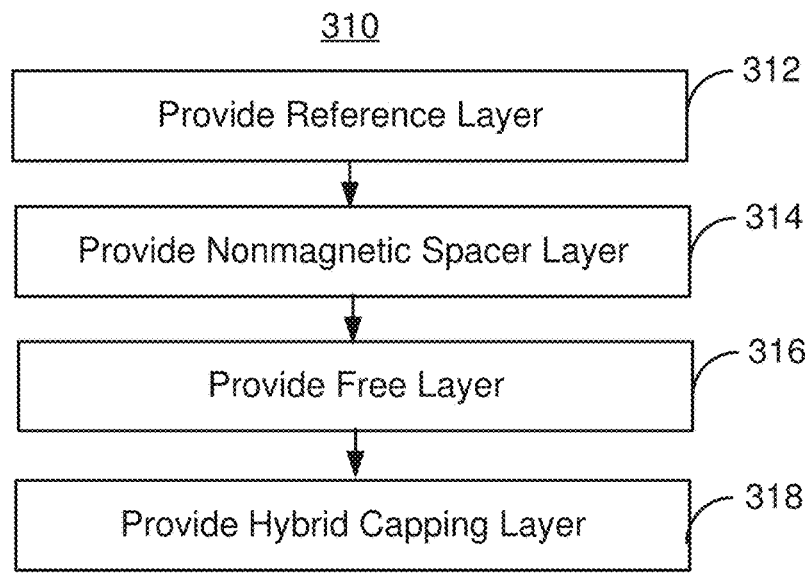
FIG. 7 is a flow chart depicting an exemplary embodiment of a method for providing a magnetic junction usable in a magnetic memory, programmable using spin transfer torque and including a hybrid capping layer.

FIG. 7 depicts an exemplary embodiment of a method 310 for fabricating a magnetic apparatus usable in a magnetic device such as an STT-MRAM, another STT device, SOT device and, therefore, in a variety of electronic devices. For simplicity, some steps may be omitted, performed in another order and/or combined. Further, the method 310 may start after other steps in forming a magnetic device have been performed. The method 310 is also described in the context of forming a single magnetic apparatus. However, multiple magnetic apparatuses may be formed substantially simultaneously. The method 310 is also described in the context of the magnetic junction 100A. However, another magnetic junction such as the magnetic junction 100 might be formed.

The reference layer 110A is provided, via step 312. Step 312 thus includes providing ferromagnetic layers 112 and 116 as well nonmagnetic layer 114. The ferromagnetic layers 116 and 112 may each have a perpendicular anisotropy energy that exceeds the out-of-plane demagnetization energy. Thus, the reference layer 110A may have its magnetic moment oriented perpendicular to plane. In other embodiments, another multilayer or a single layer may be fabricated in step 312. For example, the PEL 150 may optionally be provided as part of step 312.

The nonmagnetic spacer layer 120 is provided, via step 314. In some embodiments, a crystalline MgO tunneling barrier layer may be formed. Step 314 may include depositing MgO using, for example, radio frequency (RF) sputtering. Metallic Mg may be deposited, then oxidized in step 314 to provide a natural oxide of Mg. The MgO barrier layer/nonmagnetic spacer layer 120 may also be formed in another manner. Step 314 may include annealing the portion of the magnetic junction already formed to provide crystalline MgO tunneling barrier with a (100) orientation for enhanced tunneling magnetoresistance (TMR) of the magnetic junction.

The free layer 130 is provided, via step 316. Step 316 includes depositing the material(s) for the free layer. The free layer 130 provided in step 316 may be desired to have a perpendicular magnetic anisotropy that exceeds its demagnetization energy. The magnetic moment of the free layer may thus be stable out-of-plane, including perpendicular-to-plane. The free layer 130 provided in step 316 is also configured to be switched between stable magnetic states when a write current is passed through the magnetic junction or through a high spin orbit coupling line adjacent to the magnetic junction 103A. The free layer 130 provided in step 316 is magnetic, may have a high perpendicular magnetic anisotropy and is thermally stable at operating temperatures.

The hybrid capping layer 140A is provided, via step 318. Thus, step 318 includes providing the layers 142, 144A and 146. Fabrication of the device may be completed. For example, the edges of the magnetic junction defined. This may be carried out by providing a mask on the layers that have been deposited and ion milling the exposed portions of the layers. One or more anneals may also be performed. Note that although the 110, 150, 120, 130 and 140A layers are described as being provided, in some embodiments, steps 312, 314, 316 and 318 include blanket depositing the layers. The edges of the junction 103A and hybrid capping layer 140A may be defined after all layers have been deposited. Additional structures, such as contacts and conductive lines may also be formed for the device in which the magnetic junction is used. Fabrication of the magnetic junction may then be completed.

Using the method 310, a magnetic apparatus having improved performance may be fabricated. The effective magnetic anisotropy constant of the free layer 130 may be improved substantially without sacrificing saturation magnetization, damping constant, RA and TMR for the magnetic junction 103A/103. Consequently, the magnetic apparatus 100A fabricated using the method 310 may have improved performance and increased scalability of bit size and high temperature operation applications.

Figure 8:
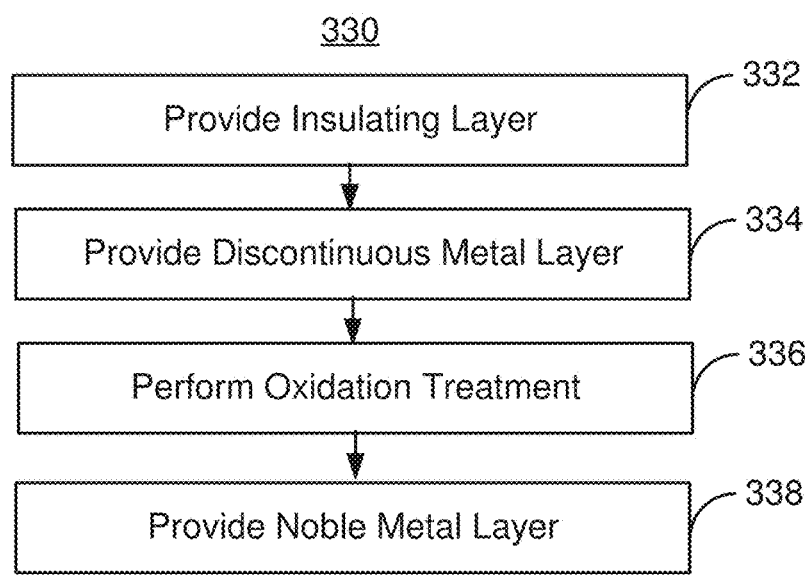
FIG. 8 is a flow chart depicting an exemplary embodiment of a method for providing a hybrid capping layer.

FIG. 8 is a flow chart depicting an exemplary embodiment of a method 330 for providing a hybrid capping layer. For simplicity, some steps may be omitted, performed in another order, include substeps and/or combined. Although described in terms of a single magnetic junction, multiple magnetic junctions may be fabricated. For simplicity, the method is described in the context of the hybrid capping layer 140A and the magnetic apparatus 100A. However, the method 330 may be used for any of the hybrid capping layers 140 and/or 140A and the magnetic junctions 103 and/or 130A.

The insulating layer 142 is deposited, via step 332. Step 332 includes depositing one or more of magnesium oxide-aluminum oxide, magnesium aluminum oxide, titanium oxide doped magnesium oxide and zirconium oxide doped magnesium oxide. Other analogous insulating layers that may function as oxygen blocking layers may be used in addition to or in lieu of the layer(s) described above.

A discontinuous metal layer is provided, via step 334. Thus, a thin metal layer is deposited in step 334. The metal layer may include or consist of one or more of Mo, W, Nb and Zr. In some embodiments, the metal layer is at least 0.5 Angstroms thick and less than three Angstroms thick. In some such embodiments, the metal layer is less than 1.5 Angstroms thick. Because the layer provided is sufficiently thin, the metal layer is discontinuous. Thus, islands of metal are formed on the insulating layer 142.

An oxidation treatment is performed, via step 336. The oxidation treatment may include one or more of a natural oxidation process, a radical oxidation process and a normal oxidation process. Thus, at least some of the metal islands formed in step 334 are oxidized in step 336. The layer formed may include molybdenum oxide, tungsten oxide, niobium oxide and zirconium oxide. Consequently, the discontinuous oxide layer 140A may be formed.

The noble metal layer is provided, via step 338. Step 338 includes depositing the noble metal, for example by sputtering. The noble metal deposited in step 338 may include or consist of at least one of Ru, Pt, Ir, Rh, Pd and Os. Step 338 may include depositing at least ten Angstroms of the noble metal. In some embodiments, at least twenty Angstroms are deposited. The desired effect(s) of the noble metal layer may be achieved by a layer that is twenty Angstroms thick. Consequently, step 338 may include depositing a layer that does not exceed one hundred Angstroms in thickness. In some embodiments, the noble metal layer provided in step 338 is not more than forty Angstroms thick. In some such embodiments, the noble metal layer is not more than thirty Angstroms thick.

Using the method 330, a hybrid capping layer 140 and/or 140A may be fabricated. When used in conjunction with a magnetic junction such as the magnetic junction(s) 103 and/or 103A, the magnetic junction 103 and/or 103A may have improved performance. The effective magnetic anisotropy constant of the free layer 130 may be improved substantially without sacrificing saturation magnetization, damping constant, RA and TMR for the magnetic junction 103A/103. Consequently, the magnetic apparatus 100 and/or 100A used in connection with the hybrid capping layer 140, 140A and/or 140B may have improved performance and increased scalability of bit size and high temperature operation applications.

A method and system for providing a magnetic apparatus and a device fabricated using the magnetic apparatus has been described. The method and system have been described in accordance with the exemplary embodiments shown, and one of ordinary skill in the art will readily recognize that there could be variations to the embodiments, and any variations would be within the spirit and scope of the method and system. Accordingly, many modifications may be made by one of ordinary skill in the art without departing from the spirit and scope of the appended claims.

We claim:

1. A magnetic apparatus residing on a substrate and usable in a magnetic device, the magnetic apparatus comprising:
   a magnetic junction; and
   a hybrid capping layer adjacent to the magnetic junction, the hybrid capping layer including an insulating layer, a discontinuous oxide layer, and a noble metal layer, the discontinuous oxide layer being between the insulating layer and the noble metal layer, the insulating layer being between the magnetic junction and the noble metal layer.

2. The magnetic apparatus of claim 1 wherein the magnetic junction further includes:
   a reference layer;
   a nonmagnetic spacer layer; and
   a free layer switchable between a plurality of stable magnetic states, the nonmagnetic spacer layer residing between the reference layer and the free layer, the free layer having a perpendicular magnetic anisotropy energy greater and an out-of-plane demagnetization energy less than the perpendicular magnetic anisotropy energy.

3. The magnetic apparatus of claim 2 wherein at least one of the free layer and the reference layer has a perpendicular magnetic anisotropy energy greater and an out-of-plane demagnetization energy less than the perpendicular magnetic anisotropy energy.

4. The magnetic apparatus of claim 2 wherein the hybrid capping layer adjoins the free layer and the free layer is between the hybrid capping layer and the nonmagnetic spacer layer.

5. The magnetic apparatus of claim 1 wherein the noble metal layer includes at least one of Ru, Pt, Ir, Rh, Pd and Os.

6. The apparatus of claim 1 wherein the noble metal layer has a thickness of at least ten Angstroms.

7. The magnetic apparatus of claim 6 wherein the thickness is at least twenty Angstroms and not more than one hundred Angstroms.

8. The magnetic apparatus of claim 1 wherein the discontinuous oxide layer includes oxide islands and metal islands.

9. The magnetic apparatus of claim 8 wherein the metal islands include at least one of Mo, W, Nb and Zr.

10. The magnetic apparatus of claim 8 wherein the discontinuous oxide layer includes at least one of molybdenum oxide, tungsten oxide, niobium oxide, zirconium oxide, Mg—Al-oxide, Mg—Ti-oxide and Mg—Zr-oxide.

11. The magnetic apparatus of claim 1 wherein the discontinuous oxide layer has a thickness of at least 0.5 Angstroms and not more than three Angstroms.

12. The magnetic apparatus of claim 1 wherein the insulating layer includes at least one of magnesium oxide-aluminum oxide (MgO—$Al_2O_3$), magnesium aluminum oxide ($MgAl_2O_4$), titanium oxide doped magnesium oxide ($TiO_2$-doped MgO) and zirconium oxide doped magnesium oxide ($ZrO_2$-doped MgO).

13. The magnetic apparatus of claim 2 wherein the free layer includes at least one of FeB, FeB—X, FeCoB, FeCoB—X, B free Fe, Fe—X, FeCo and FeCo—X, where X is selected from Be, Ni, Mo, Mg, Zr, Ta, V, Cr, W, Hf, Nb and Tb.

14. A magnetic memory residing on a substrate and comprising:
a plurality of magnetic storage cells, each of the plurality of magnetic storage cells a magnetic apparatus, the magnetic apparatus including at least one magnetic junction and a hybrid capping layer adjacent to the magnetic junction, the at least one magnetic junction including a reference layer, a nonmagnetic spacer layer, and a free layer switchable between a plurality of stable magnetic states, the nonmagnetic spacer layer residing between the reference layer and the free layer, the free layer having a perpendicular magnetic anisotropy energy greater and an out-of-plane demagnetization energy less than the perpendicular magnetic anisotropy energy, the hybrid capping layer including an insulating layer, a discontinuous oxide layer, and a noble metal layer, the discontinuous oxide layer being between the insulating layer and the noble metal layer, the insulating layer being between the free layer and the noble metal layer; and
a plurality of bit lines coupled with the plurality of magnetic storage cells.

15. A method for providing a magnetic apparatus usable in a magnetic device, the method comprising:
providing a magnetic junction; and
providing a hybrid capping layer adjacent to the magnetic junction, the hybrid capping layer including an insulating layer, a discontinuous oxide layer, and a noble metal layer, the discontinuous oxide layer being between the insulating layer and the noble metal layer, the insulating layer being between the magnetic junction and the noble metal layer.

16. The method of claim 15 wherein the step of providing the magnetic junction further includes:
providing a reference layer;
providing a nonmagnetic spacer layer; and
providing a free layer switchable between a plurality of stable magnetic states when a write current is passed through the magnetic junction, the nonmagnetic spacer layer residing between the reference layer and the free layer, the free layer having a perpendicular magnetic anisotropy energy greater and an out-of-plane demagnetization energy less than the perpendicular magnetic anisotropy energy.

17. The method of claim 15 wherein the step of providing the hybrid capping layer further includes:
providing the insulating layer;
providing the discontinuous oxide layer, the step of providing the discontinuous oxide layer further including
providing a discontinuous metal layer; and
performing an oxidation treatment of the discontinuous metal layer to form the discontinuous oxide layer; and
providing the noble metal layer on the discontinuous oxide layer.

18. The method of claim 17 wherein the oxidation treatment includes at least one of a normal oxidation treatment, a natural oxidation treatment and a radical oxidation treatment.

19. The method of claim 16 wherein the step of providing the hybrid capping layer further includes:
providing the hybrid capping layer adjacent to the free layer, the free layer being between the hybrid capping layer and the nonmagnetic spacer layer.

20. The method of claim 16 wherein the noble metal layer includes at least one of Ru, Pt, Ir, Rh, Pd and Os, wherein the discontinuous oxide layer includes at least one of molybdenum oxide, tungsten oxide, niobium oxide, zirconium oxide, Mg—Al-oxide, Mg—Ti-oxide and Mg—Zr— and wherein the insulating layer includes at least one of magnesium oxide-aluminum oxide (MgO—$Al_2O_3$), magnesium aluminum oxide ($MgAl_2O_4$), titanium oxide doped magnesium oxide ($TiO_2$-doped MgO) and zirconium oxide doped magnesium oxide ($ZrO_2$-doped MgO).

* * * * *